United States Patent
Yoshida

(10) Patent No.: US 12,274,083 B2
(45) Date of Patent: Apr. 8, 2025

(54) SEMICONDUCTOR DEVICE

(71) Applicant: Sumitomo Electric Industries, Ltd., Osaka (JP)

(72) Inventor: Shigeki Yoshida, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 628 days.

(21) Appl. No.: 17/474,475

(22) Filed: Sep. 14, 2021

(65) Prior Publication Data

US 2022/0085200 A1 Mar. 17, 2022

(30) Foreign Application Priority Data

Sep. 16, 2020 (JP) .................. 2020-155356

(51) Int. Cl.
  *H10D 30/47* (2025.01)
  *H10D 62/17* (2025.01)
  *H10D 62/824* (2025.01)
  *H10D 62/85* (2025.01)

(52) U.S. Cl.
  CPC ......... *H10D 30/475* (2025.01); *H10D 62/328* (2025.01); *H10D 62/824* (2025.01); *H10D 62/8503* (2025.01)

(58) Field of Classification Search
  CPC ............ H01L 29/7783; H01L 29/7784; H01L 29/7785; H10D 30/474; H10D 30/4732
  See application file for complete search history.

(56) References Cited

U.S. PATENT DOCUMENTS

| 10,249,711 | B2 | 4/2019 | Shinohara et al. | |
| 10,388,746 | B2 | 8/2019 | Shinohara et al. | |
| 2013/0334573 | A1* | 12/2013 | Ostermaier | H01L 21/30604 257/E21.403 |
| 2020/0411663 | A1* | 12/2020 | Saptharishi | H01L 29/778 |
| 2021/0005739 | A1* | 1/2021 | Sun | H01L 29/205 |
| 2023/0352599 | A1 | 11/2023 | Saito et al. | |

FOREIGN PATENT DOCUMENTS

| JP | 2011124509 | * 6/2011 |
| WO | 2021/229702 A1 | 11/2021 |

OTHER PUBLICATIONS

Palacios, T. "Use of Double-Channel Heterostructures to Improve the Access Resistance and Linearity in GaN-Based HEMTs" IEEE Transactions on Electron Dev. vol. 53, No. 3 Mar. 2006 pp. 562-565 (Year: 2006).*

(Continued)

*Primary Examiner* — Grant S Withers
(74) *Attorney, Agent, or Firm* — Volpe Koenig

(57) ABSTRACT

A semiconductor device includes a substrate, a semiconductor layer provided on the substrate and having a plurality of GaN channel layers and a plurality of AlGaN barrier layers which are alternately laminated from a substrate side, a source electrode and a drain electrode electrically connected to the GaN channel layers, and a gate electrode provided between the source electrode and the drain electrode to control a potential of the semiconductor layer, wherein an Al composition ratio of an AlGaN barrier layer closest to the substrate is smaller than that of an AlGaN barrier layer second closest to the substrate.

9 Claims, 14 Drawing Sheets

(56) References Cited

OTHER PUBLICATIONS

Heikman, S. "High Conductivity modulation doped AlGaN/GaN multiple channel heterostructures" Journ. Of App. Phys. vol. 94, No. 8, Oct. 15, 2003 pp. 5321-5325 (Year: 2003).*
Kuan, S. "Molecular beam epitaxy for high-performance Ga-face GaN electron devices" Semicond. Sci. Technol. Jun. 21, 2013 pp. 1-15 (Year: 2013).*
K. Shinohara, et al., "GaN-Based Multi-Channel Transistors with Lateral Gate for Linear and Efficient Millimeter-Wave Power Amplifiers," 2019, IEEE/MTT-S International Microwave Symposium, pp. 1133-1135.

* cited by examiner

SEMICONDUCTOR DEVICE

CROSS-REFERENCE TO RELATED APPLICATION

This application claims priority based on Japanese Patent Application No. 2020-155356, filed on Sep. 16, 2020, and the entire contents of the Japanese patent application are incorporated herein by reference.

FIELD OF THE INVENTION

The present disclosure relates to a semiconductor device.

BACKGROUND ART

There has been known a multi-channel transistor in which GaN channel layers and AlGaN barrier layers are alternately laminated on a substrate (U.S. patent Ser. No. 10/388,746, and 2019 IEEE/MTT-S International Microwave Symposium p. 1133-1135). In the multi-channel transistor, two dimensional electron gas (2DEG) is generated in the GaN channel layer. Note that the technique related to the present disclosure is disclosed in U.S. patent Ser. No. 10/249,711.

SUMMARY OF THE INVENTION

A semiconductor device includes a substrate, a semiconductor layer provided on the substrate and having a plurality of GaN channel layers and a plurality of AlGaN barrier layers which are alternately laminated from a substrate side, a source electrode and a drain electrode electrically connected to the GaN channel layers, and a gate electrode provided between the source electrode and the drain electrode to control a potential of the semiconductor layer, wherein an Al composition ratio of an AlGaN barrier layer closest to the substrate is smaller than that of an AlGaN barrier layer second closest to the substrate.

DESCRIPTION OF EMBODIMENTS

Figure 1:
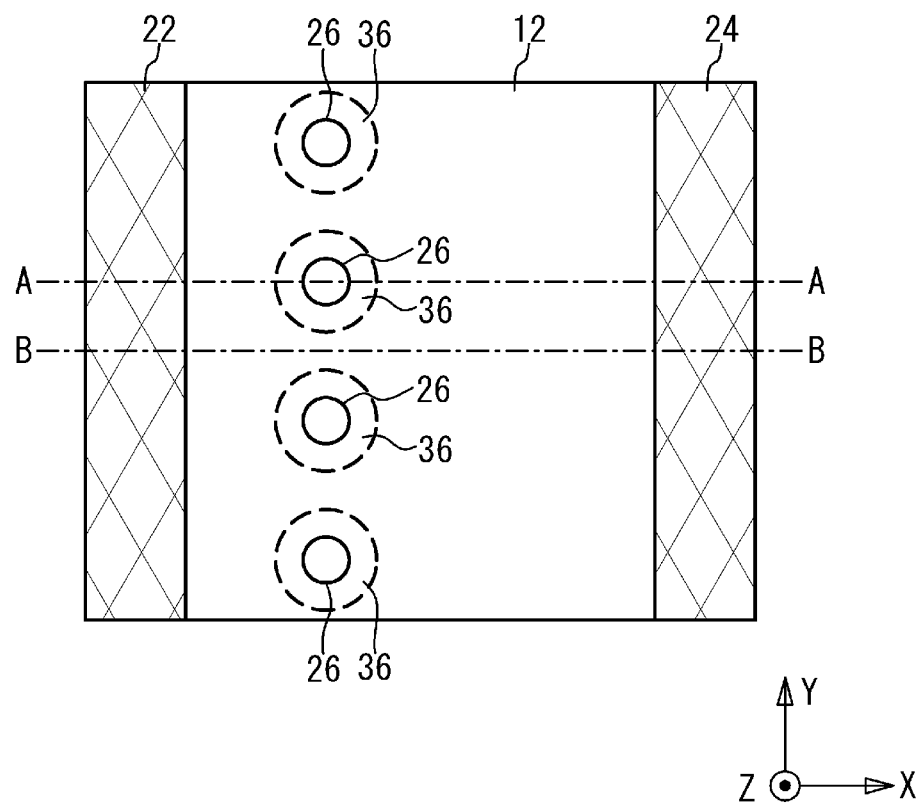
FIG. 1 is a plan view illustrating a semiconductor device according to a first embodiment.

In the multi-channel transistor, it is considered preferable to pass a larger current through a channel layer closest to the substrate from the viewpoint of thermal efficiency, in order to dissipate the heat from the substrate. Therefore, it is required to increase an electron concentration of the 2DEG in the channel layer closest to the substrate. In a single channel transistor, as the Al composition ratio of the AlGaN barrier layer increases, the 2DEG concentration increases. Therefore, in the multi-channel transistor, it is considered to increase the Al composition ratio of the AlGaN barrier layer closest to the substrate. However, the electron concentration of the 2DEG in the channel layer second closest to the substrate becomes too small.

It is an object of the present disclosure to provide a semiconductor device that can appropriately adjust the electron concentration in the channel layers.

Description of Embodiments of the Present Disclosure

First, the contents of embodiments of the present disclosure will be listed and described.

(1) A semiconductor device according to an embodiment of the present disclosure includes: a substrate; a semiconductor layer provided on the substrate and having a plurality of GaN channel layers and a plurality of AlGaN barrier layers which are alternately laminated from a substrate side; a source electrode and a drain electrode electrically connected to the GaN channel layers; and a gate electrode provided between the source electrode and the drain electrode to control a potential of the semiconductor layer; wherein an Al composition ratio of an AlGaN barrier layer closest to the substrate is smaller than that of an AlGaN barrier layer second closest to the substrate. Thereby, the electron concentration in the channel layer can be adjusted appropriately.

(2) When the thickness of the AlGaN barrier layer closest to the substrate is T1 and the thickness of the AlGaN barrier layer second closest to the substrate is T2, it is preferable that a formula "$|T1-T2|/(T1+T2) \leq 0.2$" is satisfied.

(3) It is preferable that the Al composition ratio of the AlGaN barrier layer second closest to the substrate is smaller than that of an AlGaN barrier layer third closest to the substrate.

(4) It is preferable that the Al composition ratio of an AlGaN barrier layer farthest from the substrate is smaller than that of an AlGaN barrier layer second farthest from the substrate.

(5) When the above (4) is satisfied, it is preferable that when a largest thickness among the AlGaN barrier layers is T16 max and a smallest thickness among the AlGaN barrier layers is T16 min, a formula "$(T16\ max - T16\ min)/(T16\ max + T16\ min) \leq 0.2$" is satisfied.

(6) When the above (5) is satisfied, it is preferable that when a largest thickness among the GaN channel layers excluding a GaN channel layer closest to the substrate is T14 max, and a smallest thickness among the GaN barrier layers excluding the GaN channel layer closest to the substrate is T14 min, a formula "$(T14\ max - T14\ min)/(T14\ max + T14\ min) \leq 0.2$" is satisfied.

(7) When the above (3) is satisfied, it is preferable that the Al composition ratio of the AlGaN barrier layer closest to the substrate, the Al composition ratio of the AlGaN barrier layer second closest to the substrate, the Al composition ratio of an AlGaN barrier layer farthest from the substrate, and the Al composition ratio of an AlGaN barrier layer second farthest from the substrate are 0.1 or more and 0.4 or less.

(8) It is preferable that the gate electrode is provided so as to reach the GaN channel layer closest to the substrate from an upper surface of the semiconductor layer.

(9) It is preferable that each of the GaN channel layers and the AlGaN barrier layers is laminated with four or more layers.

(10) It is preferable that the Al composition ratio of the AlGaN barrier layer closest to the substrate and the Al composition ratio of the AlGaN barrier layer second closest to the substrate are 0.1 or more and 0.4 or less.

(11) When the above (3) is satisfied, it is preferable that the Al composition ratio of an AlGaN barrier layer farthest from the substrate is smaller than that of an AlGaN barrier layer second farthest from the substrate.

Details of Embodiments of the Present Disclosure

A description will be given of embodiments of the method for manufacturing the semiconductor device according to embodiments of the present disclosure, with reference to drawings. The present disclosure is not limited to the specifically disclosed embodiments and variations but may include other embodiments and variations without departing from the scope of the present invention.

First Embodiment

Figure 2:
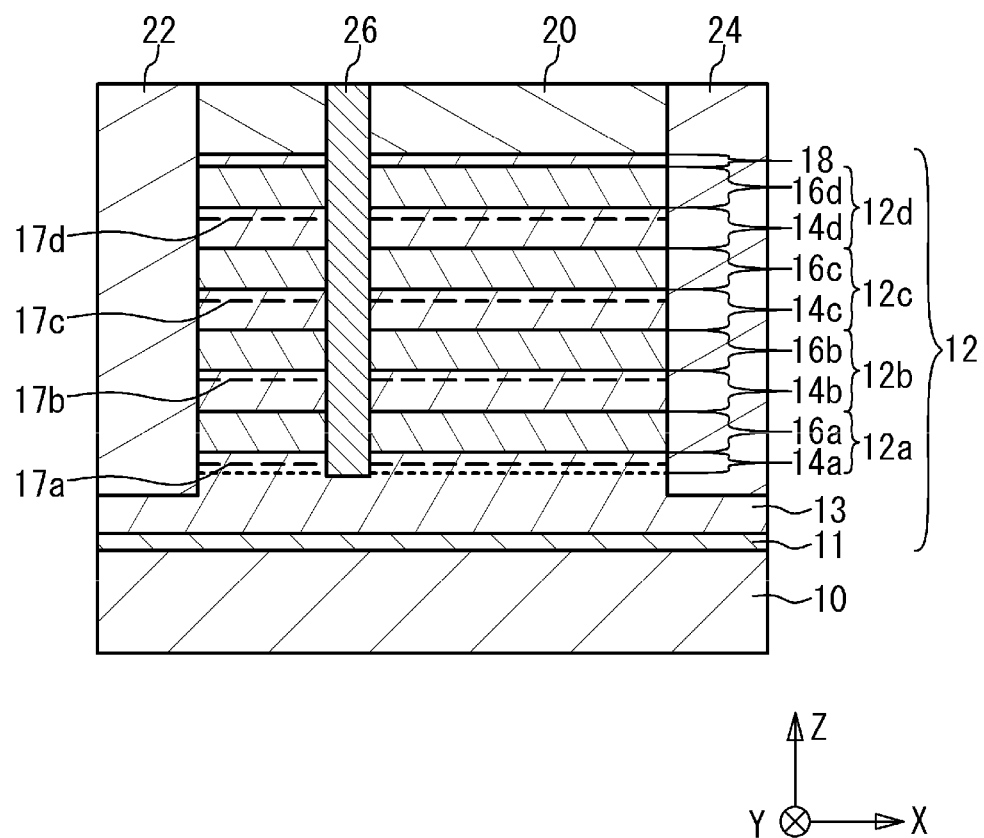
FIG. 2 is a cross-sectional view taken along a line A-A of FIG. 1.
Figure 3:
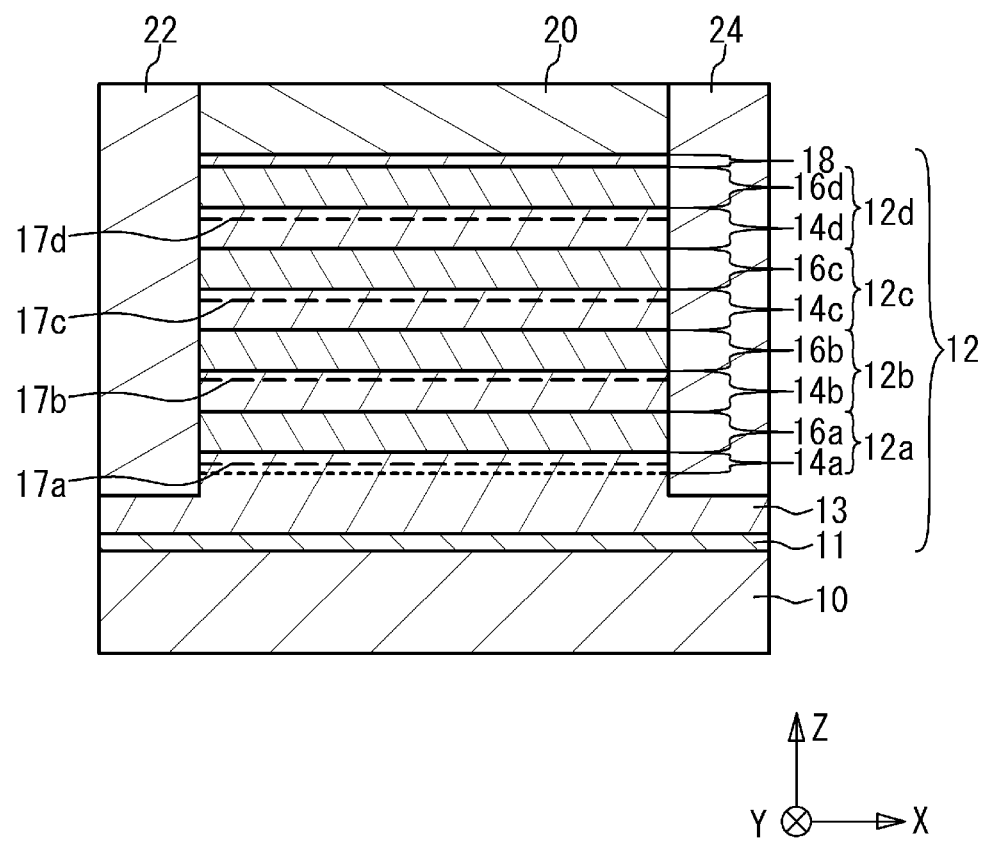
FIG. 3 is a cross-sectional view taken along a line B-B of FIG. 1.

FIG. 1 is a plan view illustrating a semiconductor device according to a first embodiment. FIG. 2 is a cross-sectional view taken along a line A-A of FIG. 1 and FIG. 3 is a cross-sectional view taken along a line B-B of FIG. 1. In FIG. 1, depletion layers 36 are illustrated by broken lines, and an insulating film 20 is not illustrated. A stacking direction of a substrate 10 and a semiconductor layer 12 is defined as a Z direction. A direction which is parallel to upper surfaces (main surface) of the substrate 10 and the semiconductor layer 12 and in which carriers conduct from a source electrode 22 to a drain electrode 24 is defined as an X direction. A direction which is orthogonal to the X direction and in which gate electrodes 26 are aligned is defined as a Y direction.

As illustrated in FIGS. 1 to 3, the semiconductor layer 12 is provided on the substrate 10. A nucleation layer 11, a buffer layer 13, semiconductor layers 12a, 12b, 12c, 12d and a cap layer 18 are laminated in this order on the substrate 10 as the semiconductor layer 12. The semiconductor layer 12a has a channel layer 14a, and a barrier layer 16a provided on the channel layer 14a. The semiconductor layer 12b has a channel layer 14b, and a barrier layer 16b provided on the channel layer 14b. The semiconductor layer 12c has a channel layer 14c, and a barrier layer 16c provided on the channel layer 14c. The semiconductor layer 12d has a channel layer 14d, and a barrier layer 16d provided on the channel layer 14d. 2DEG 17a to 17d are generated in the channel layers 14a to 14d, respectively.

The source electrode 22 and the drain electrode 24 that reach from the upper surface of the semiconductor layer 12 to the buffer layer 13 are provided on the semiconductor layer 12. The source electrode 22 and the drain electrode 24 are electrically connected to the 2DEG 17a to 17d of the channel layers 14a to 14d. The insulating film 20 is provided on the semiconductor layer 12 between the source electrode 22 and the drain electrode 24. The plurality of gate electrodes 26 are provided between the source electrode 22 and the drain electrode 24 and are arranged in the Y direction. A planar shape of the gate electrode 26 is circular. The planar shape of the gate electrode 26 may be rectangular, elliptical, or the like. The gate electrode 26 controls the potential of the semiconductor layer 12.

The substrate 10 is, for example, a SiC substrate, a sapphire substrate, or a GaN substrate. The upper surface of the substrate 10 is, for example, a (0001) plane. The semiconductor layer 12 is a nitride semiconductor layer. The nucleation layer 11 is, for example, an AlN layer. The buffer layer 13 and the channel layers 14a to 14d are GaN layers. The barrier layers 16a to 16d are AlGaN layers. The cap layer 18 is, for example, a GaN layer. The buffer layer 13 and the channel layer 14a are the same GaN layer, but a lower part of the GaN layer functions as the buffer layer 13 and an upper part thereof functions as the channel layer 14a. Therefore, for convenience, the lower part and the upper part are described as the buffer layer 13 and the channel layer 14a. No intentional dopants are added to the buffer layer 13, the channel layers 14a to 14d, the barrier layers 16a to 16d, and the cap layer 18. A dopant concentration is, for example, $1\times10^{16}$ cm$^{-3}$ or less. The barrier layers 16a to 16d may be intentionally free of dopants, but the dopants may be intentionally added. The dopant concentration in the barrier layers 16a to 16d may be, for example, $1\times10^{16}$ cm$^{-3}$ or more.

Each of the source electrode 22 and the drain electrode 24 includes, for example, a titanium film and an aluminum film from the semiconductor layer 12 side (i.e., in this order from a position close to the semiconductor layer 12). A source region and a drain region connected to the channel layers 14a to 14d and having a dopant concentration of $1\times10^{19}$ cm$^{-3}$ or more are provided in the semiconductor layer 12, and the source electrode 22 and the drain electrode 24 may be provided on the source region and the drain region, respectively. The gate electrode 26 includes, for example, a nickel film and a gold film from the semiconductor layer 12 side (i.e., in this order from a position close to the semiconductor layer 12). The insulating film 20 is, for example, a silicon nitride film, a silicon oxide film, or a silicon nitride oxide film.

As illustrated in FIG. 1, the depletion layer 36 corresponding to a gate voltage applied to the gate electrode 26 is formed around the gate electrode 26. The 2DEG 17a to 17d are hardly formed in the channel layers 14a to 14d within the depletion layer 36. The 2DEG 17a to 17d are formed in the channel layers 14a to 14d within a region other than the depletion layer 36. A current flowing between the source electrode 22 and the drain electrode 24 can be controlled by the potential applied to the gate electrode 26.

(Simulation)

Figure 4:
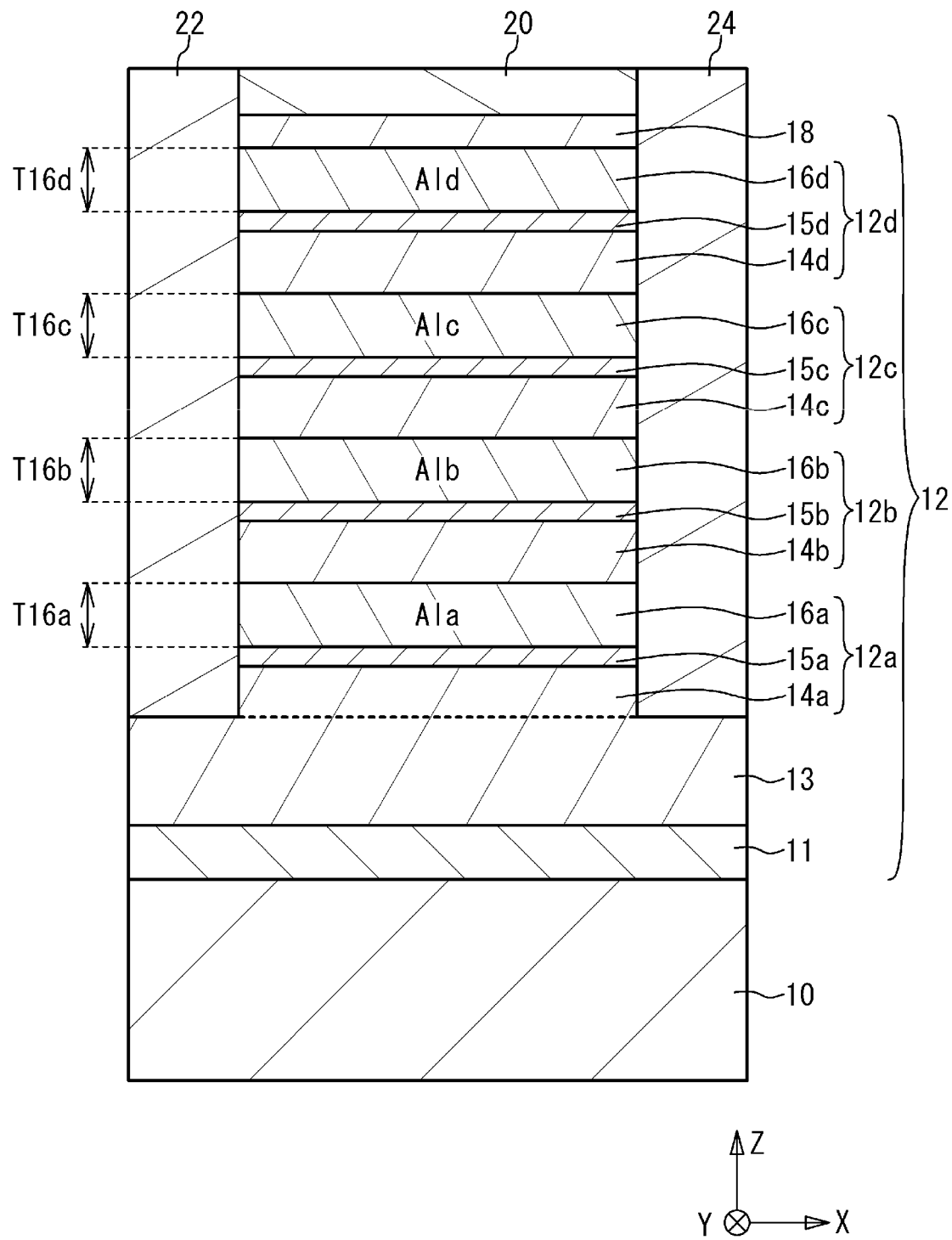
FIG. 4 is a cross-sectional view of the structure of a model used in the simulation.

Electron concentrations of the 2DEG 17a to 17d generated in the respective channel layer 14a to 14d were simulated. FIG. 4 is a cross-sectional view of the structure of a model used in the simulation. In the semiconductor layers 12a to 12d, spacer layers 15a to 15d are provided between the channel layers 14a to 14d and the barrier layers 16a to 16d, respectively. The thicknesses of the barrier layers 16a to 16d are T16a to T16d, respectively, and the Al composition ratios of the barrier layers 16a to 16d are Ala to Ald, respectively. The Al composition ratio is a composition ratio of Al to Al and Ga, and corresponds to x when the composition of the barrier layers 16a to 16d is expressed as $Al_xGa_{1-x}N$.

The simulation conditions are as follows. The thickness and material of each layer are as follows.

Substrate 10: Thickness is 10 μm. Material is SiC.
Nucleation layer 11: Thickness is 20 nm. Material is AlN.
Buffer layer 13+Channel layer 14a: Thickness is 600 nm. Material is GaN.
Each of Channel layers 14b to 14d: Thickness is 15 nm. Material is GaN.
Each of Spacer layers 15a to 15d: Thickness is 1 nm. Material is AlN.
Each of Barrier layers 16a to 16d: Thickness is T16a to T16d. Material is AlGaN.
Cap layer 18: Thickness is 3 nm. Material is GaN.
Insulating film 20: Thickness is 20 nm. Material is SiN.

The physical characteristics of the respective materials are as follows. Eg is an energy bandgap and EA is an electron affinity.

GaN: Eg=3.42 eV, EA=4.3 eV
AlN: Eg=5.76 eV, EA=2.545 eV
AlGaN: Eg=5.76x+3.42 (1−x)−1.15x (1−x) eV, EA=4.3−0.75 (2.34x−1.15x (1−x)) eV

Wherein x is the Al composition ratio, and indicates x when the composition of AlGaN is $Al_xGa_{1-x}N$.

SiN: Eg=5 eV, EA=3.51 eV
SiC: Eg=2.9 eV, EA=3.5 eV

The doping concentrations of the substrate 10 and the nucleation layer 11 were set to $1\times10^{10}$ cm$^{-3}$ assuming semi-insulating properties. The doping concentration of the semiconductor layer 12 other than the nucleation layer 11 was set to $7\times10^{15}$ cm$^{-3}$ on the assumption that no dopant was intentionally added. Work functions of the source electrode 22 and the drain electrode 24 were set to 4.2 eV. A positive fixed charge of $5\times10^{12}$ cm$^{-2}$ was assumed as an interface level at an interface between the cap layer 18 and the insulating film 20. The depth of each of the source electrode 22 and the drain electrode 24 from the upper surface of the semiconductor layer 12 was set to 122 nm.

Simulations were performed for four samples A to D. Table 1 indicates the conditions of the barrier layers 16a to 16d of the samples A to D.

TABLE 1

| | Al composition ratio [%] | | | | Thickness [nm] | | | |
|---|---|---|---|---|---|---|---|---|
| sample | Ala | Alb | Alc | Ald | T16a | T16b | T16c | T16d |
| A | 30 | 30 | 30 | 30 | 15 | 15 | 15 | 15 |
| B | 30 | 25 | 20 | 15 | 15 | 15 | 15 | 15 |
| C | 15 | 22 | 24 | 15 | 15 | 15 | 15 | 15 |
| D | 15 | 22 | 24 | 15 | 15 | 30 | 15 | 15 |

As illustrated in Table 1, in the sample A, the Al composition ratios Ala to Ald of the barrier layers 16a to 16d are all 30%, and the thicknesses T16a to T16d are all 15 nm. In the sample B, the Al composition ratios Ala to Ald of the barrier layers 16a to 16d are 30%, 25%, 20%, and 15%, respectively, and the Al composition ratios decrease as the barrier layers are away from the substrate 10. The thicknesses T16a to T16d are all 15 nm. In the sample C, the Al composition ratios Ala to Ald of the barrier layers 16a to 16d are 15%, 22%, 24%, and 15%, respectively. The Al composition ratio Ala of the barrier layer 16a closest to the substrate 10 is small, the Al composition ratio increases as the barrier layer is away from the substrate 10, and the Al composition ratio Ald of the farthest barrier layer 16d is small. The thicknesses T16a to T16d are all 15 nm. In the sample D, the Al composition ratios Ala to Ald are the same as those in the sample C. The thicknesses T16a, T16c, and T16d are 15 nm, and the thickness T16b is 30 nm. The samples A and B correspond to comparative examples.

Figure 5:
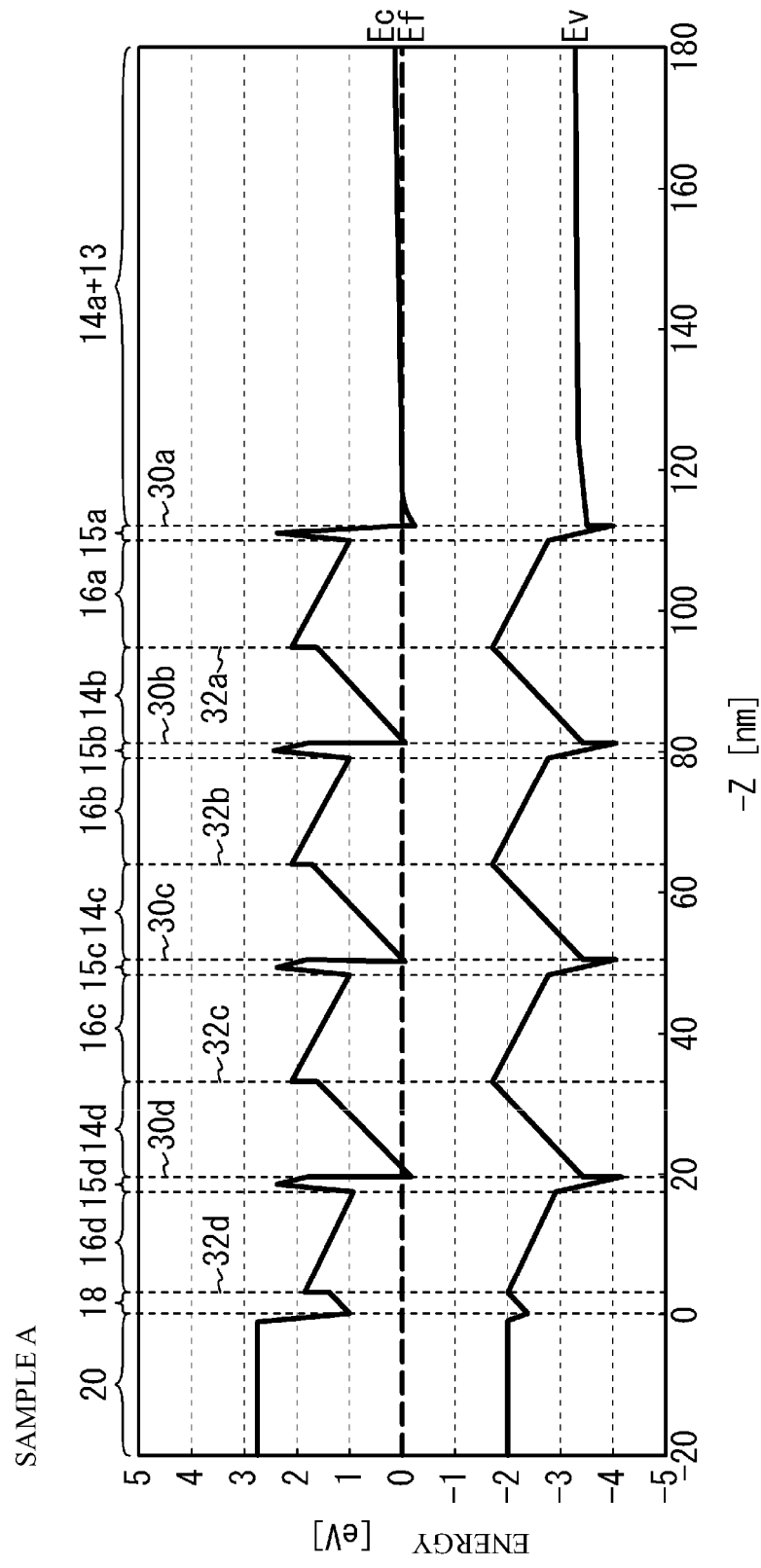
FIG. 5 is a diagram illustrating a band diagram in a sample A.

FIG. 5 is a diagram illustrating a band diagram in the sample A. Ec indicates an energy at the bottom of a conduction band, Ev indicates an energy at the top of a valence band, and Ef indicates a Fermi level. A horizontal axis indicates a position in a −Z direction when the interface between the semiconductor layer 12 and the insulating film 20 in FIG. 4 is 0 nm, and a vertical axis indicates an energy when the Fermi level Ef is 0 eV.

Spontaneous polarization occurs in the channel layers 14a to 14d and the barrier layers 16a to 16d. Further, piezo polarization occurs in the barrier layers 16a to 16d due to a stress caused by a difference in the lattice constants between the channel layers 14a to 14d and the barrier layers 16a to 16d. When the channel layers 14a and 14d are GaN layers and the barrier layers 16a to 16d are AlGaN layers, the spontaneous polarization in the barrier layers 16a to 16d is larger than the spontaneous polarization in the channel layers 14a to 14d. When the upper surface of the substrate 10 is, for example, the (0001) plane, the directions of the piezo polarization and the spontaneous polarization in the barrier layers 16a to 16d are the same as each other.

Thereby, negative charges are generated in the channel layers 14a to 14d near interfaces 30a to 30d between the barrier layers 16a to 16d and the channel layers 14a to 14d through the spacer layers 15a to 15d, respectively. As a result, the Ec of the interfaces 30a to 30d becomes low. On the other hand, positive charges are generated at respective interfaces 32a to 32d between the barrier layers 16a to 16d, and the channel layers 14b to 14d and the cap layer 18 facing portions of the barrier layers 16a to 16d opposite to the substrate 10. As a result, the Ec of the interfaces 32a to 32d facing the portions of the barrier layer 16a to 16d opposite to the substrate 10 becomes high. Since the spacer layers 15a to 15d are 1/10 or less in thickness as compared with the barrier layers 16a to 16d, the polarization in the spacer layers 15a to 15d can be almost ignored. The Ec of the portions of the channel layers 14a to 14d near the interfaces 30a to 30d becomes the Fermi level Ef or less, and the 2DEG 17a to 17d are formed.

Figure 6:
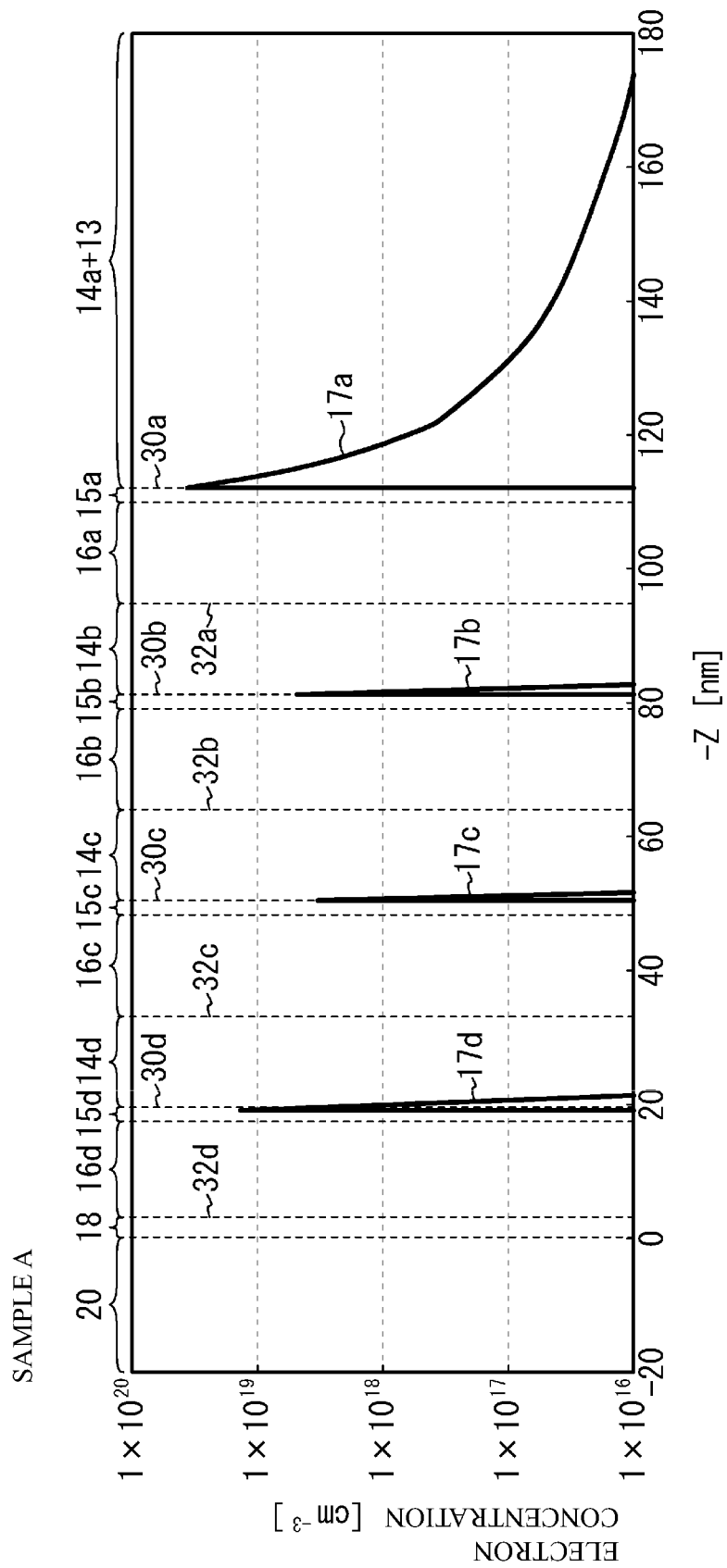
FIG. 6 is a diagram illustrating an electron concentration in the sample A.

FIG. 6 is a diagram illustrating the electron concentration in the sample A. A horizontal axis is the same as the horizontal axis of FIG. 5, and a vertical axis is the electron concentration. As illustrated in FIG. 6, the 2DEG 17a to 17d are formed in portions of the channel layers 14a to 14d in the vicinity of the interfaces 30a to 30d, respectively. The electron concentrations of the 2DEG 17b and 17c are lower than the electron concentration of the 2DEG 17a. The electron concentration of the 2DEG 17d is higher than the electron concentrations of the 2DEG 17b and 17c.

The heat generated in the channel layers 14a to 14d is released to the outside through the substrate 10. Therefore, the heat generated in the channel layer farther from the substrate 10 is less likely to be released to the outside. When the temperature of the channel layer rises, the resistance in the channel layer increases and the characteristics deteriorate. It is preferable to reduce the electron concentration of the 2DEG in the channel layer far from the substrate 10 in order to suppress the temperature rise due to the heat generated in the channel layer far from the substrate 10.

It is expected that when the Al composition ratio is increased in the individual barrier layers 16a to 16d, the spontaneous polarization and the piezo polarization in the individual barrier layers 16a to 16d are increased. Therefore, it is considered that the electron concentrations of the 2DEG 17a to 17d increase. For this reason, in the sample B, the Al composition ratio of the barrier layer 16d farther from the substrate 10 is smaller than that of the barrier layer 16a closer to the substrate 10.

Figure 7:
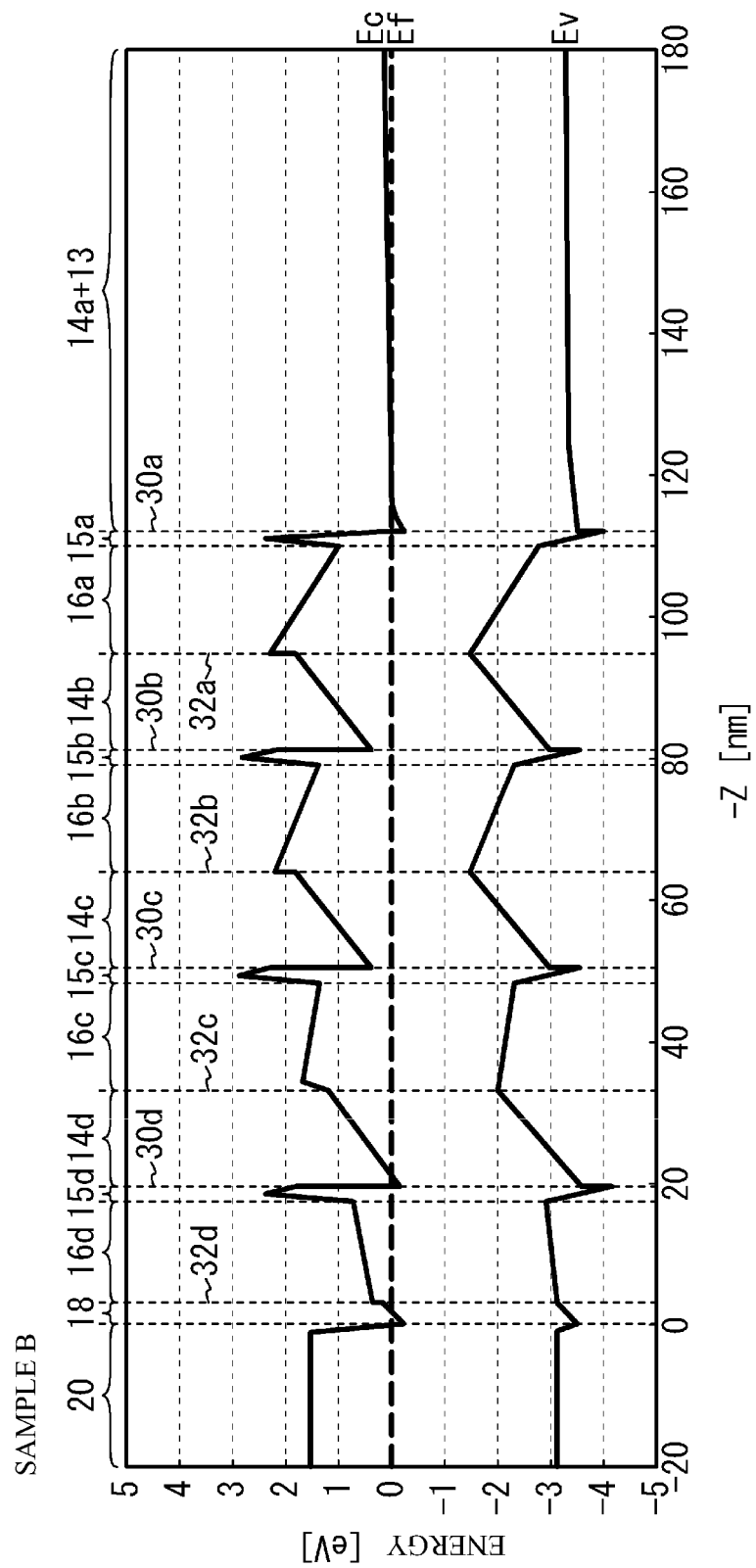
FIG. 7 is a diagram illustrating a band diagram in a sample B.

FIG. 7 is a diagram illustrating a band diagram in the sample B. As illustrated in FIG. 7, the Ec near the interfaces 30b and 30c is high, and the Ec of the channel layers 14b and 14c is higher than the Fermi level Ef.

Figure 8:
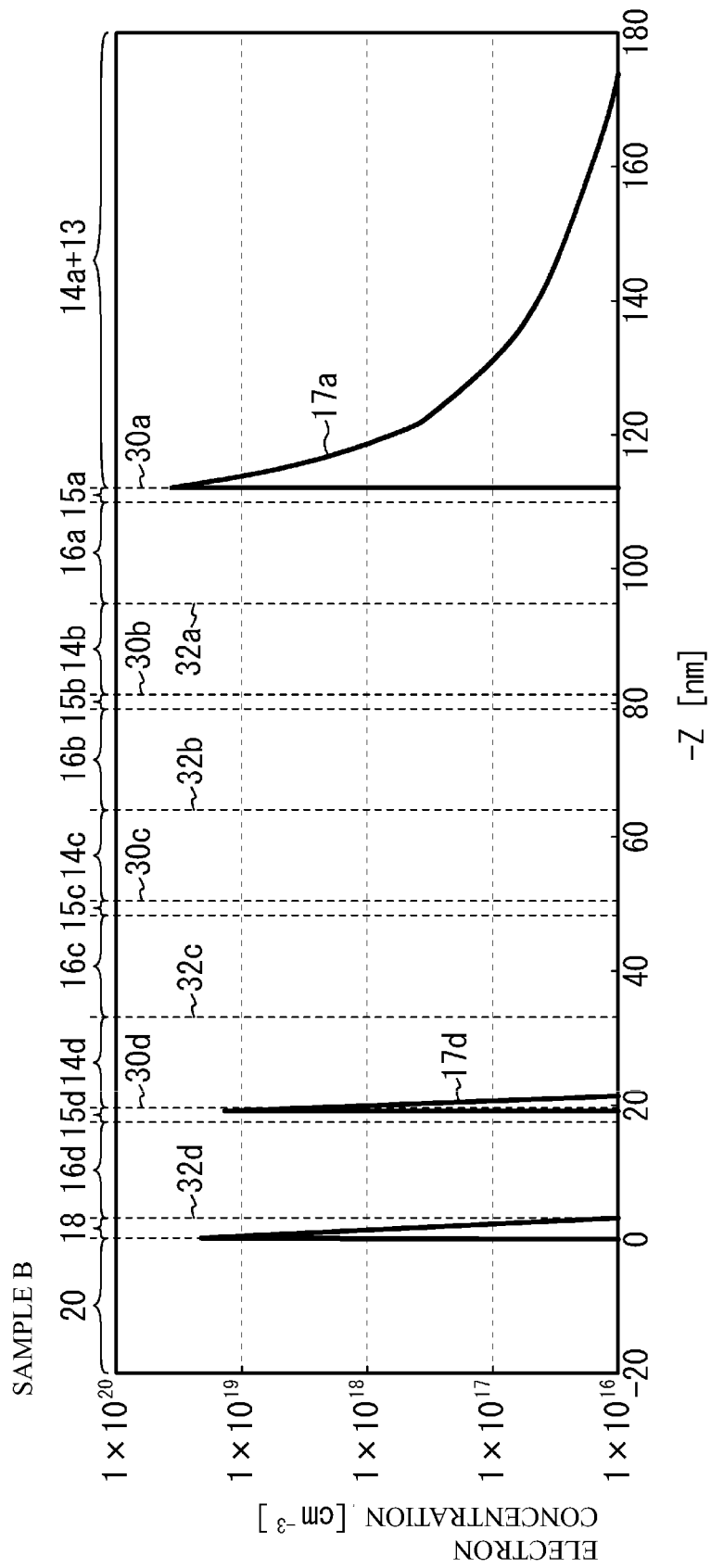
FIG. 8 is a diagram illustrating an electron concentration in the sample B.

FIG. 8 is a diagram illustrating the electron concentration in the sample B. As illustrated in FIG. 8, the 2DEG 17b and 17c are not generated. Also, the electron concentration of the 2DEG 17d is close to that of the 2DEG 17a. Further, the electron concentration of the cap layer 18 is high.

Thus, in the sample B, the electron concentration of the 2DEG 17d is high. Furthermore, the 2DEGs 17b and 17c are not generated. Even if the Al composition ratio is increased as the channel layer is farther from the substrate 10 as in sample B, the electron concentrations of the 2DEG 17a to 17d do not match expected values.

In particular, in the sample B, the Al composition ratio in the barrier layer 16a close to the substrate 10 is set to 30%, so that the Ec at the interface 30a becomes low and the Ec at the interface 32a becomes high. On the other hand, in the sample B, the Al composition ratio in the barrier layer 16b is set to a value of 25%, which is lower than the value of 30% in the sample A. As a result, the polarization in the barrier layer 16b is considered to be smaller in the sample B than in the sample A, and the Ec at the interface 30a is considered to be higher in the sample B than in the sample A. Therefore, it is considered that the 2DEG 17b is not generated as illustrated in FIG. 8.

Based on the above consideration, in the sample C, the Al composition ratio is reduced in the barrier layer 16a closest to the substrate 10, while the Al composition ratio is increased in the barrier layer 16b second closest to the substrate 10 in order to increase the polarization. In order to further increase the polarization in the barrier layer 16c which is further away from the substrate 10, the Al composition ratio is further increased. In the sample C, the Al composition ratio of the barrier layer 16c is maximum.

Figure 9:
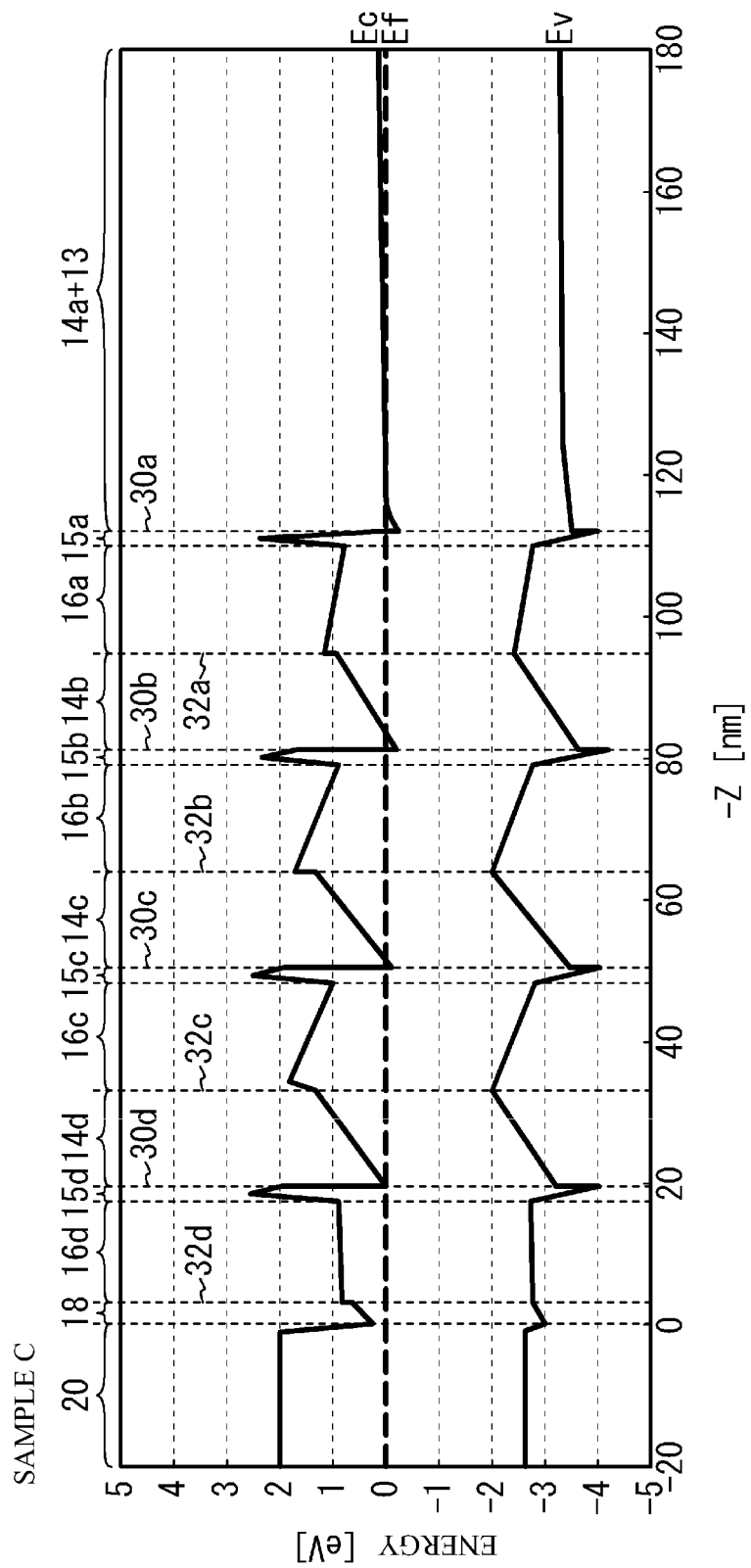
FIG. 9 is a diagram illustrating a band diagram in a sample C.

FIG. 9 is a diagram illustrating a band diagram in the sample C. As illustrated in FIG. 9, the Ec of the channel layers 14a to 14d near the interfaces 30a to 30d is lower than the Fermi level Ef.

Figure 10:
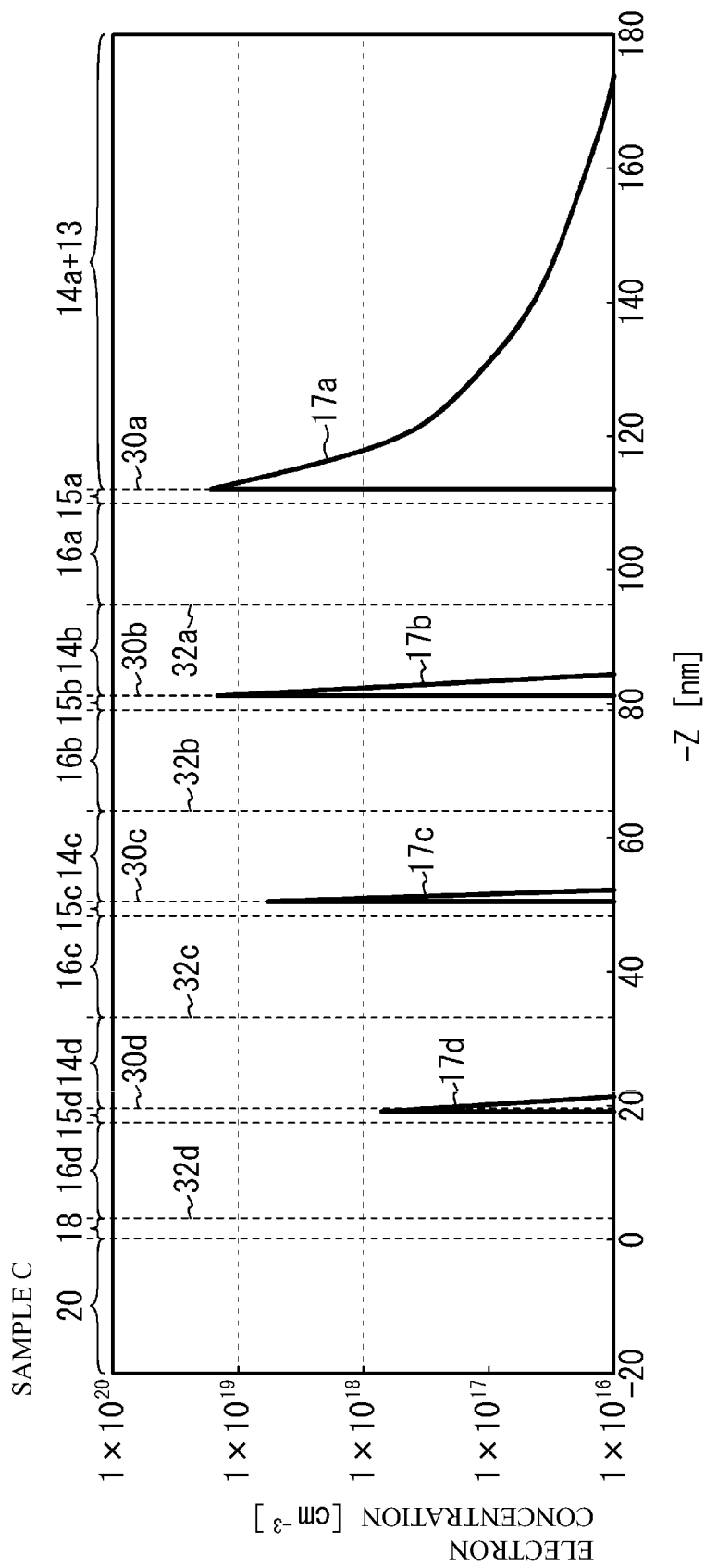
FIG. 10 is a diagram illustrating an electron concentration in the sample C.

FIG. 10 is a diagram illustrating the electron concentration in the sample C. As illustrated in FIG. 10, the 2DEG 17a to 17d are generated. The electron concentration of the 2DEG 17a closest to the substrate 10 is the highest, and the electron concentration is lower as the 2DEG is farther from the substrate 10. In this way, it was possible to realize the electron concentrations of the 2DEG 17a to 17d close to an ideal state.

Figure 11:
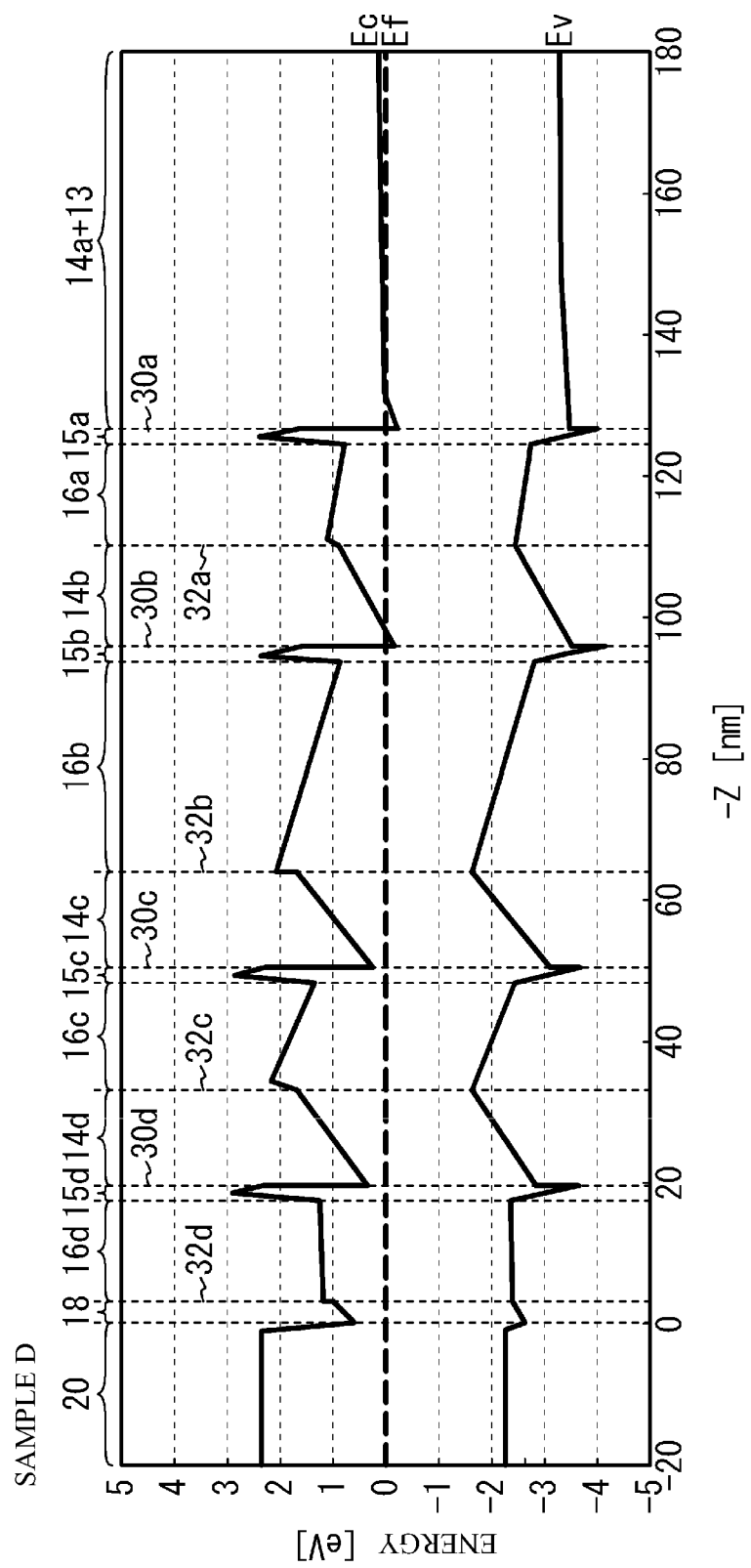
FIG. 11 is a diagram illustrating a band diagram in a sample D.

FIG. 11 is a diagram illustrating a band diagram in the sample D. As illustrated in FIG. 11, even if the Al composition ratios of the barrier layers 16a to 16d are the same as those of the sample C, when the barrier layer 16b is thickened, the Ec of the interface 32b becomes high and the Ec of the interface 30c does not become low.

Figure 12:
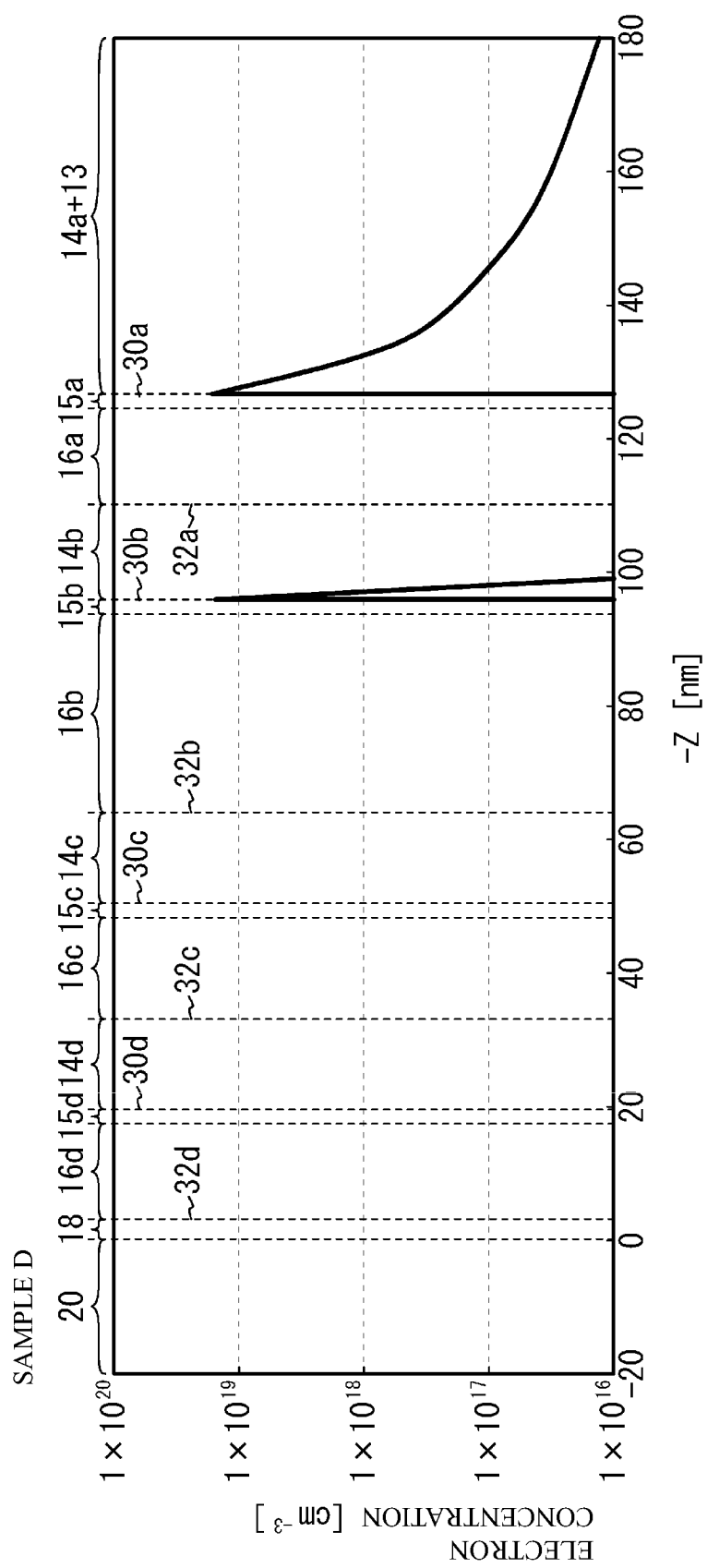
FIG. 12 is a diagram illustrating an electron concentration in the sample D.

FIG. 12 is a diagram illustrating the electron concentration in the sample D. As illustrated in FIG. 12, the 2DEG 17c and 17d are not generated.

As the polarization in the barrier layers 16a to 16d increases, the Ec at the interfaces 30a to 30d becomes low, but the Ec at the interfaces 32a to 32d becomes high. In the sample B, since the Al composition ratio of the barrier layer 16a is large, the Ec of the interface 32a becomes high, and the Ec of the channel layer 14b becomes high. Therefore, it is considered that the 2DEG 17b is not generated at the interface 30b. Similarly, in the sample B, since the Al composition ratio of the barrier layer 16b is large, the Ec of the interface 32b becomes high, and the Ec of the channel layer 14c becomes high. Therefore, it is considered that the 2DEG 17c is not generated. On the other hand, the Ec of the barrier layer 16d becomes low due to the fixed charge at the interface between the insulating film 20 and the cap layer 18. Thereby, the electron concentration of the 2DEG 17d becomes high.

As in the sample D in FIG. 11, when the barrier layer 16b becomes thicker, the Ec at the interface 32b becomes higher than that in sample C. Thus, the Ec of the interfaces 32a to 32c increases substantially in proportion to the product of the Al composition ratios and the thicknesses of the barrier layers 16a to 16c.

According to the first embodiment, in the semiconductor layer 12, the GaN channel layers 14a to 14d and the barrier layers 16a to 16d are alternately laminated from the substrate 10 side. The Al composition ratio Ala of the AlGaN barrier layer 16a closest to the substrate 10 is smaller than the Al composition ratio Alb of the AlGaN barrier layer 16b second closest to the substrate 10. As a result, it is suppressed that the Ec of the interface 32a becomes too high, and the 2DEG 17b is formed in the channel layer 14b.

When the thickness T16b of the barrier layer 16b is too thicker than the thickness T16a of the barrier layer 16a as in the sample D, the 2DEG 17c is not formed in the channel layer 14c. Therefore, it is preferable that the thickness T16a of the barrier layer 16a and the thickness T16b of the barrier layer 16b are substantially equal to each other. Thus, it is preferable that the thicknesses T16a to T16d of the barrier layers 16a to 16d are substantially equal to each other. Here, the above "substantially equal" means that the thicknesses are equal to a degree in which the 2DEG 17a to 17d are formed, and a difference of ±20% is allowed. That is, a formula "|1 T16a−T16b (T16a+T16b)≤0.2" is satisfied. A formula "1 T16a−T16b (T16a+T16b)≤0.1" is more preferable. Here, T16a−T16b indicates an absolute value of (T16a−T16b). When the largest thickness among the thicknesses T16a to T16d is T16 max and the smallest thickness is T16 min, a formula "(T16 max−T16 min)/(T16 max+T16 min)≤0.2" is satisfied. Also, a formula "(T16 max−T16 min)/(T16 max+T16 min)≤0.1" is more preferable.

Further, it is preferable that the thicknesses of the channel layers 14b to 14d are substantially equal to each other. For example, when the largest thickness among the channel layers 14b to 14d is T14 max and the smallest thickness is T14 min, a formula "(T14 max−T14 min)/(T14 max+T14 min)≤0.2" is satisfied. Also, a formula "(T14 max−T14 min)/(T14 max+T14 min)≤0.1" is more preferable.

The Al composition ratio Alb of the barrier layer 16b second closest to the substrate 10 is smaller than the Al composition ratio Alc of the barrier layer 16c third closest to the substrate 10. Thereby, it is suppressed that the Ec of the interface 32b becomes too high, and the 2DEG 17c is formed in the channel layer 14c.

The Al composition ratio Ald of the AlGaN barrier layer 16d farthest from the substrate 10 is smaller than the Al composition ratios Alb and Alc of the barrier layers 16b and 16c second and third closest to the substrate 10. This allows the electron concentration of the 2DEG 17d formed in the channel layer 14d to be smaller than the electron concentrations of the 2DEG 17b and 17c.

In order to form the 2DEG 17a to 17d, the Al composition ratios Ala to Ald of the barrier layers 16a to 16d are preferably 0.1 or more and 0.4 or less, and more preferably 0.15 or more and 0.3 or less. A difference between the Al composition ratios Alb and Ala is preferably 0.05 or more. A difference between the Al composition ratios Alc and Alb is preferably larger than the difference between the Al composition ratios Alb and Ala. It is preferable that the Al composition ratios Ala and Ald are substantially equal to each other.

The Al composition ratio in each of the barrier layers 16a to 16d is substantially uniform to the extent of manufacturing error. For example, a difference between a maximum value and a minimum value of the Al composition ratio in one barrier layer is 10% or less of an average value of the Al composition ratio.

The GaN channel layers 14a to 14d and the AlGaN barrier layers 16a to 16d may include intentional or unintentional impurities other than GaN and AlGaN, respectively. For example, silicon or the like may be included as the dopant.

Each of the channel layers and the barrier layers is preferably laminated with three or more layers, more preferably with four or more layers, and may be laminated with five or more layers. Thereby, a drain current can be increased and a power density can be increased.

Second Embodiment

Figure 13:
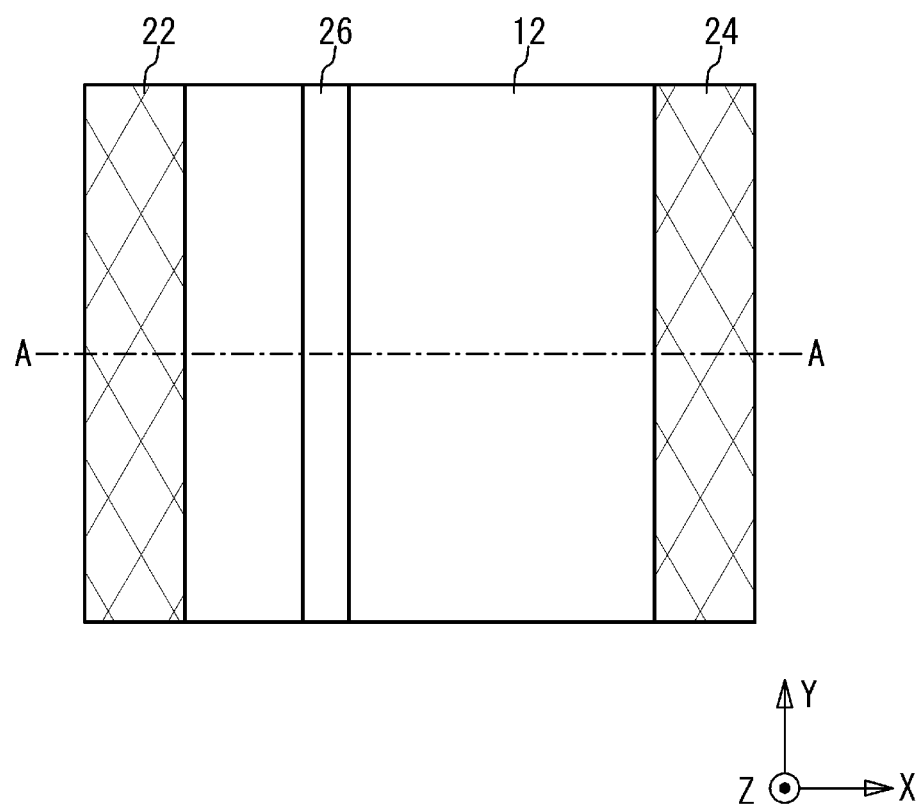
FIG. 13 is a plan view illustrating a semiconductor device according to a second embodiment.
Figure 14:
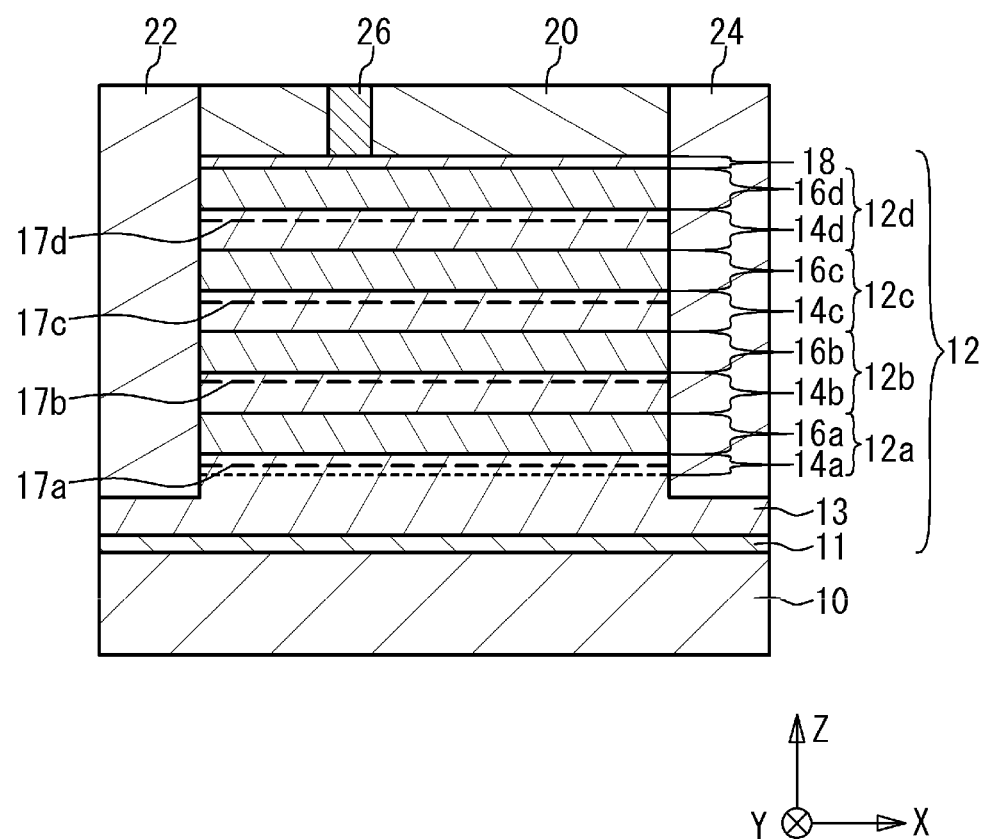
FIG. 14 is a cross-sectional view taken along a line A-A of FIG. 13.

FIG. 13 is a plan view illustrating a semiconductor device according to a second embodiment. FIG. 14 is a cross-sectional view taken along a line A-A of FIG. 13. As illustrated in FIGS. 13 and 14, the gate electrode 26 is provided on the semiconductor layer 12. The gate electrode 26 extends in the Y direction. Other elements are the same as those in the first embodiment, and the description thereof is omitted.

When the gate electrode 26 is provided on the semiconductor layer 12 as in the second embodiment, it is difficult for the gate electrode 26 to control all the channel layers 14a to 14d. Therefore, as in the first embodiment, the gate electrode 26 is preferably provided so as to reach the channel layer 14a closest to the substrate 10 from the upper surface of the semiconductor layer 12.

It should be considered that the above embodiments disclosed here are exemplary in all respects and not restrictive. The scope of the present invention is not limited to the specific embodiments of the disclosure. It is to be understood that the scope of the present invention is defined in the appended claims and includes equivalence of the description of the claims and all changes within the scope of the claims.

What is claimed is:

1. A semiconductor device comprising:
a substrate;
a semiconductor layer provided on the substrate and having a plurality of GaN channel layers and a plurality of AlGaN barrier layers which are alternately laminated in a lamination direction from the substrate;
a source electrode and a drain electrode electrically connected to the plurality of GaN channel layers; and
a gate electrode provided between the source electrode and the drain electrode to control a potential of the semiconductor layer,
wherein the plurality of AlGaN barrier layers includes a first AlGaN barrier layer closest to the substrate and a second AlGaN barrier layer second closest to the substrate,
wherein the first AlGaN barrier layer has a first Al composition ratio a second Al composition ratio of the second AlGaN barrier layer,
wherein the plurality of GaN channel layers includes a first GaN channel layer closest to the substrate,
wherein the gate electrode penetrates the plurality of AlGaN barrier layers in the lamination direction and reaches the first GaN channel layer, and
wherein the plurality of GaN channel layers includes four or more GaN channel layers in the lamination direction and the plurality of AlGaN barrier layers includes four or more AlGaN barrier layers in the lamination direction.

2. The semiconductor device according to claim 1, wherein
when a thickness of the first AlGaN barrier layer is T1 and the thickness of the second AlGaN barrier layer is T2, a formula "|T1−T2|/(T1+T2)≤0.2" is satisfied.

3. The semiconductor device according to claim 1, wherein
the second Al composition ratio of the second AlGaN barrier layer is smaller than a third Al composition ratio of a third AlGaN barrier layer, of the plurality of AlGaN barrier layers, that is third closest to the substrate.

4. The semiconductor device according to claim 1, wherein
the plurality of AlGaN barrier layers further includes a third AlGaN barrier layer second farthest from the substrate, and a fourth AlGaN barrier layer farthest from the substrate,
a fourth Al composition ratio of the fourth AlGaN barrier layer is smaller than a third Al composition ratio of the third AlGaN barrier layer.

5. The semiconductor device according to claim 4, wherein
each of the plurality of AlGaN barrier layers has a thickness in the lamination direction, and
when one of the plurality of AlGaN barrier layers has a largest thickness T16 max and another of the plurality of AlGaN barrier layers has a smallest thickness T16 min, a formula "(T16 max−T16 min)/(T16 max+T16 min)≤0.2" is satisfied.

6. The semiconductor device according to claim 5, wherein
each of the plurality of GaN channel layers has a thickness in the lamination direction, and
when of one of the plurality of GaN channel layers excluding the first GaN channel layer has a largest thickness T14 max, and another of the plurality of GaN channel layers excluding the first GaN channel layer has a smallest thickness T14 min, a formula "(T14 max−T14 min)/(T14 max+T14 min)≤0.2" is satisfied.

7. The semiconductor device according to claim 1, wherein
the first Al composition ratio and the second Al composition ratio are 0.1 or more and 0.4 or less.

8. A semiconductor device comprising
a substrate;
a semiconductor layer provided on the substrate and having a plurality of GaN channel layers and a plurality of AlGaN barrier layers which are alternately laminated from a substrate side;
a source electrode and a drain electrode electrically connected to the plurality of GaN channel layers; and
a gate electrode provided between the source electrode and the drain electrode to control a potential of the semiconductor layer,
wherein the plurality of AlGaN barrier layers includes a first AlGaN barrier layer closest to the substrate, a second AlGaN barrier layer second closest to the substrate, a third AlGaN barrier layer second farthest from the substrate, and a fourth AlGaN barrier layer farthest from the substrate, wherein the first AlGaN barrier layer has a first Al composition ratio smaller than a second Al composition ratio of the second AlGaN barrier layer, wherein the fourth AlGaN barrier layer has a fourth Al composition ratio smaller than a third Al composition ratio of the third AlGaN barrier layer, and wherein the first Al composition ratio, the second Al composition ratio, the third Al composition ratio, and the fourth Al composition ratio are 0.1 or more and 0.4 or less.

9. A semiconductor device comprising a substrate;

a semiconductor layer provided on the substrate and having a plurality of GaN channel layers and a plurality of AlGaN barrier layers which are alternately laminated from a substrate side;

a source electrode and a drain electrode electrically connected to the plurality of GaN channel layers; and a gate electrode provided between the source electrode and the drain electrode to control a potential of the semiconductor layer, wherein the plurality of AlGaN barrier layers includes a first AlGaN barrier layer closest to the substrate, a second AlGaN barrier layer second closest to the substrate, a third AlGaN barrier layer third closest to the substrate, a fourth AlGaN barrier layer that is second farthest from the substrate, and a fifth AlGaN barrier layer that is farthest from the substrate, wherein the first AlGaN barrier layer has a first Al composition ratio smaller than a second Al composition ratio of the second AlGaN barrier layer, wherein the second Al composition ratio is smaller than that of a third Al composition ratio of the third AlGaN barrier layer, and wherein a fifth Al composition ratio of the fifth AlGaN barrier layer is smaller than a fourth Al composition ratio of the fourth AlGaN barrier layer.

* * * * *